United States Patent
Yamamoto

(10) Patent No.: US 7,295,251 B2
(45) Date of Patent: Nov. 13, 2007

(54) TELEVISION TUNER CAPABLE OF IMPROVING IMAGE DISTURBANCE WITH RECEIVING UHF BAND

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 525 days.

(21) Appl. No.: 11/041,156

(22) Filed: Jan. 21, 2005

(65) Prior Publication Data

US 2005/0162568 A1    Jul. 28, 2005

(30) Foreign Application Priority Data

Jan. 27, 2004   (JP)   ............... 2004-000277

(51) Int. Cl.
 H04N 5/00   (2006.01)
 H04N 5/44   (2006.01)
 H04N 5/50   (2006.01)
 H04B 1/18   (2006.01)
(52) U.S. Cl. ............... 348/731; 348/607; 348/725; 455/180.4; 455/191
(58) Field of Classification Search ........... 348/607, 348/725, 731; 455/180.4, 191.2
See application file for complete search history.

(56) References Cited

U.S. PATENT DOCUMENTS 6,566,953 B2 *   5/2003   Yamamoto ............... 330/277
6,864,925 B2 *   3/2005   Yamamoto ............... 348/731
6,900,850 B2 *   5/2005   Yamamoto ............... 348/731
6,933,984 B2 *   8/2005   Yamamoto et al. ....... 348/731
6,950,152 B2 *   9/2005   Yamamoto ............... 348/731
7,139,039 B2 * 11/2006   Yamamoto ............... 348/731
7,142,833 B2 * 11/2006   Hibino et al. ........... 455/193.1

FOREIGN PATENT DOCUMENTS

JP    11-266407    9/1999
JP    2003-134410  5/2003

* cited by examiner

Primary Examiner—Brian P. Yenke
(74) Attorney, Agent, or Firm—Joseph A. Calvaruso; Chadbourne & Parke LLP

(57) ABSTRACT

The present invention provides to provide a television tuner capable of improving image disturbance when receiving a UHF band television signal. The television tuner comprises a tuning circuit having a tuning circuit having two varactor diodes connected in series with a connection point between the two varactor diodes serving as an output terminal and a coupling inductive element having its one end connected to an input terminal of the tuning circuit and the other end connected to an input terminal of an television signal. One varactor diode is connected to the input terminal of the tuning circuit, the other varactor diode is interposed between the output terminal and a ground, and a first capacitive element is connected between the other end of the inductive element and the connection point between the two varactor diodes.

3 Claims, 5 Drawing Sheets

TELEVISION TUNER CAPABLE OF IMPROVING IMAGE DISTURBANCE WITH RECEIVING UHF BAND

BACKGROUND OF THE INVENTION

1. Field of the Invention

The present invention relates to a television tuner, and particularly, to a television tuner capable of improving image disturbance when receiving a UHF band television signal.

2. Description of the Related Art

FIG. 5 shows a structure of a conventional television tuner. In FIG. 5, VHF-band and UHF-band television signals are input to a VHF input tuning circuit 2 and a UHF input tuning circuit 3 through a trap circuit 1 for removing an unnecessary signal such as an FM broadcasting signal.

The VHF input tuning circuit 2 comprises a tuning varactor diode 2a of which anode is connected to a ground, a high-band coil 2b, a low-band coil 2c, a low-band coil 2d and a high-band coil 2e, which are connected in series to a cathode in sequential high-frequency wise and are connected in parallel to the tuning varactor diode 2a in high-frequency wise, and a switch diode 2f connected in parallel to the two low-band coils 2c and 2d in high-frequency wise. The high-band coil 2e at the low potential side is connected to a ground in high-frequency wise through a DC cut capacitor 2g. In addition, the television signal is input to a connection point between the two low-band coils 2c and 2d, and a connection point between the cathode of the tuning varactor diode 2a and the high-band coil 2b serves as an output terminal of the VHF input tuning circuit 2.

In addition, a connection point between the high-band coil 2e and the DC cut capacitor 2g is connected to a ground through a resistor 2h and is connected to a power supply terminal B. Therefore, a bias voltage is applied to the anode of the switch diode 2f. In addition, the cathode of the switch diode 2f is applied with a switching voltage having a high level (5 volt) or a low level (0 volt) from a band switching terminal Sw. The cathode of the tuning varactor diode 2a is applied with a tuning voltage from a tuning voltage terminal Tu.

At a next stage of the VHF input tuning circuit 2, a VHF high frequency amplifier 4 is provided, and the VHF input tuning circuit 2 and the VHF high frequency amplifier 4 are coupled with each other by a coupling varactor diode 5. At a next stage of the VHF high frequency amplifier 4, a VHF interstage tuning circuit 10 is provided.

Furthermore, a capacitor 8 is connected between the connection point of the two low-band coils 2c and 2d and the anode of the coupling varactor diode 5, and a capacitor 9 is connected between the cathode of the switch diode 2f and the anode of the coupling varactor diode 5. The capacitor 8 acts to attenuate the image frequency band, together with the high-band coil 2b, the low-band coil 2c and the coupling varactor diode 5.

The UHF input tuning circuit 3 has a coil 3a whose one end is connected to a ground through a DC cut capacitor 3f and two tuning varactor diodes 3b and 3c. The two tuning varactor diodes 3b and 3c have the same characteristics and cathodes are connected to each other. The anode of one tuning varactor diode 3b is connected to the other end of the coil 3a. A connection point between the coil 3a and the tuning varactor diode 3b is connected to the connection point between the low-band coils 2c and 2d and is coupled with the trap circuit 1. In addition, the anode of the other tuning varactor diode 3c is connected to the connection point between the coil 3a and the DC cut capacitor 3f through a tuning frequency correcting capacitor 3d and a resistor 3e.

In addition, the cathodes of the two tuning varactor diodes 3b and 3c are connected to the tuning terminal Tu and are connected to a UHF high frequency amplifier 12 through a DC cut capacitor 11. At a next stage of the UHF high frequency amplifier 12, an UHF interstage tuning circuit 13 is provided.

In the above-mentioned structure, in the case of receiving the VHF band television signal, the VHF high frequency amplifier 4 becomes an operation state and the UHF high frequency amplifier 12 becomes a non-operation state. In the case of receiving the UHF band television signal, the UHF high frequency amplifier 12 becomes an operation state and the VHF high frequency amplifier 4 becomes a non-active state.

In addition, in the case of receiving the high band television signal in the VHF band, the switch diode 2f is turned on and the VHF input tuning circuit 2 is tuned to the high band. In the case of receiving the low band television signal in the VHF band, the switch diode 2f is turned off and the VHF input tuning circuit 2 is turned to the low band.

In addition, the tuning frequency is changed by the tuning voltage applied to the tuning varactor diode 2a.

Further, since in the UHF input tuning circuit 3, a bias voltage V is applied from the VHF input tuning circuit to the anodes of the two tuning varactor diodes 3b and 3c, the range of the tuning frequency becomes widens. In addition, the tracking with a local oscillating frequency is obtained by the tuning frequency correcting capacitor 3d. (for example, see Japanese Unexamined Patent Application Publication No. 2003-134410 (FIG. 1)).

In the above-mentioned structure, since the capacitor for attenuating the image frequency band is provided in the VHF input tuning circuit but is not provided in the UHF input tuning circuit, there is a problem in that the disturbance ratio of the image when receiving the UHF band television signal is lower than or equal to 60 dB.

SUMMARY OF THE INVENTION

Accordingly, the present invention has been made to solve the above-mentioned problems and it is an object of the present invention to provide a television tuner capable of improving image disturbance when receiving a UHF band television signal.

In order to solve the above-mentioned problems, according to a first aspect of the present invention, there is provided a television tuner comprising: a tuning circuit having two varactor diodes connected in series with a connection point between the two varactor diodes serving as an output terminal, and a coupling inductive element having its one end connected to an input terminal of the tuning circuit and the other end connected to an input terminal of a television signal, wherein one of the varactor diodes is connected to the input terminal of the tuning circuit, the other of the varactor diodes is interposed between the output terminal and a ground, and a first capacitive element is connected between the connection point of the two varactor diodes and the other end of the inductive element.

Further, according to a second aspect of the present invention, a second capacitive element is interposed between the other of the varactor diodes and the ground, and a third capacitive element is connected between a connection point of the other of the varactor diodes and the second capacitive element and the other end of the inductive element.

Further, according to a third aspect of the present invention, the tuning circuit has a tuning inductive element having its one end connected to the input terminal and the other end is connected to the ground, cathodes of the two varactor diodes are connected to each other, an anode of one of the varactor diodes is connected to the input terminal and an anode of the other of the varactor diodes is connected to the ground through a resistor.

According to the present invention, since one varactor diode is coupled to the input terminal of the tuning circuit, the other varactor diode is interposed between the output terminal and the ground and the first capacitive element is connected between the connection point of the two varactor diodes and the other end of the inductive element, the location of the image frequency for the received frequency is attenuated, thereby improving the image disturbance ratio.

In addition, according to the present invention, since the second capacitive element is interposed between the other varactor diode and the ground and the third capacitive element is connected between the connection point of the other varactor diode and the second capacitive element and the other end of the inductive element, the location of the image frequency for the received frequency is attenuated, thereby further improving the image disturbance.

In addition, according to the present invention, since the turning circuit has the tuning inductive element having its one end connected to the input terminal and the other end connected to the ground, the cathodes of the two varactor diodes are connected to each other, the anode of one varactor diode is connected to the input terminal and the anode of the other varactor diode is connected to the ground through a resistor, the capacitive values of the two varactor diodes can be simultaneously changed by the tuning voltage.

DESCRIPTION OF THE PREFERRED EMBODIMENTS

Hereinafter, embodiments of the present invention will now be described in detail with reference to the accompanying drawings.

Figure 1:
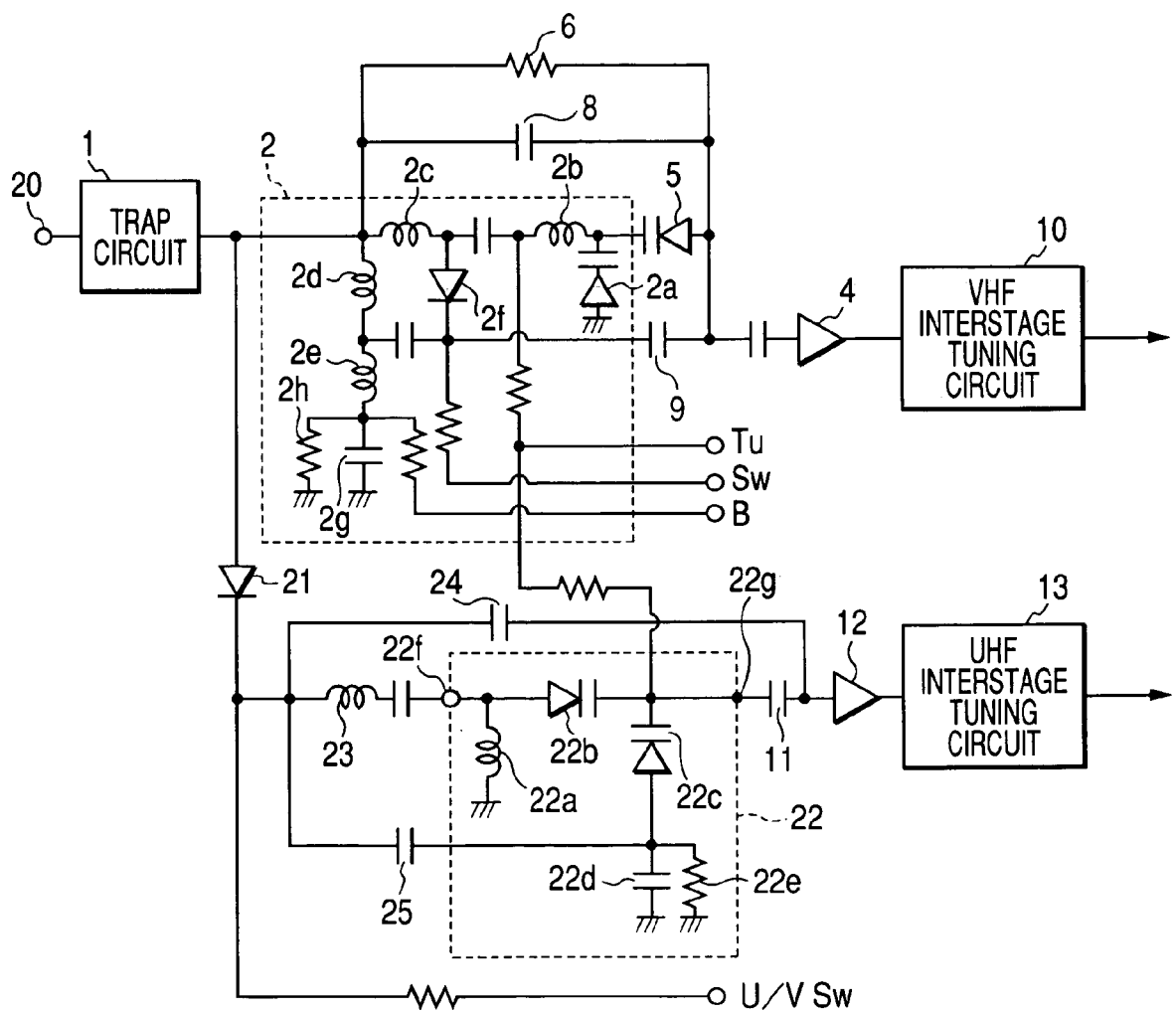
FIG. 1 is a circuit diagram showing a structure of a television tuner according to the present invention.

FIG. 1 shows a structure of a television tuner according to the present invention. In FIG. 1, VHF-band and UHF-band television signals input to an input terminal 20 of a television signal is input to a VHF input tuning circuit 2 and a UHF input tuning circuit 22 through a trap circuit 1 for removing an unnecessary signal such as a FM broadcasting signal.

Figure 5:
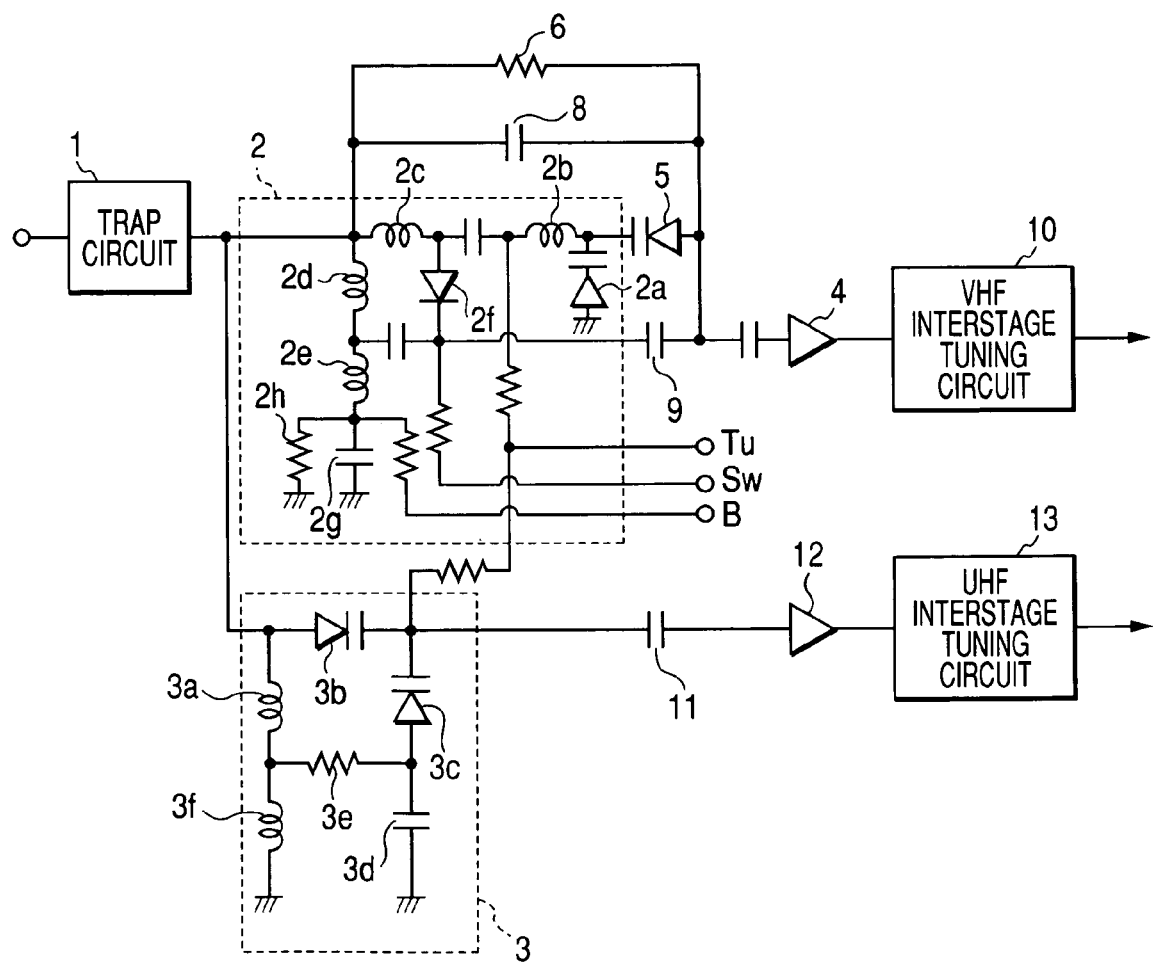
FIG. 5 is a circuit diagram showing a structure of a conventional television tuner.

A structure of the VHF input tuning circuit 2 is the same as that of the conventional VHF input tuning circuit shown in FIG. 5, and has a tuning varactor diode 2a of which an anode is connected to a ground, a high-band coil 2b, a low-band coil 2c, a low-band coil 2d and a high-band coil 2e which are connected in series to a cathode in sequential high-frequency wise and are connected in parallel to the tuning varactor diode 2a in high-frequency wise, and a switch diode 2f which is connected in parallel to two low-band coils 2c and 2d in high-frequency wise. The high-band coil 2e at the lower potential side is connected to a ground in high-frequency wise through a DC cut capacitor 2g. Further, a connection point between the two low-band coils 2c and 2d serves as an input terminal and this input terminal is connected to the trap circuit 1. In addition, a connection point between the cathode of the tuning varactor diode 2a and the high-band coil 2b serves as an output terminal of the VHF input tuning circuit 2.

In addition, a connection point between the high-band coil 2e and the DC cut capacitor 2g is connected to a ground through a resistor 2h and is connected to a power supply terminal B. Therefore, a bias voltage is applied to the anode of the switch diode 2f. In addition, a switching voltage having a high level (5 volt) or a low level (0 volt) is applied from a band switching terminal Sw to the cathode of the switch diode 2f. The cathode of the tuning varactor diode 2a is applied with a tuning voltage from a tuning voltage terminal Tu.

At a next stage of the VHF input tuning circuit 2, a VHF high frequency amplifier 4 is provided, and the VHF input tuning circuit 2 and the VHF high frequency amplifier 4 are coupled with each other through a coupling varactor diode 5. At a next stage of the VHF high frequency amplifier 4, a VHF interstage tuning circuit 10 is provided.

In addition, a capacitor 8 is connected between the connection point (input terminal) of the two low-band coils 2c and 2d and the anode of the coupling varactor diode 5, and a capacitor 9 is connected between the cathode of the switch diode 2f and the anode of the coupling varactor diode 5. The capacitor 8 acts to attenuate the image frequency band, together with the high-band coil 2b, the low-band coil 2c and the coupling varactor diode 5.

The UHF input tuning circuit 22 has a tuning inductive element 22a its one end connected to an input terminal 22f and the other end connected to a ground, and two tuning varactor diode 22b and 22c of which cathodes are connected to each other and which have the same characteristic. The anode of one varactor diode 22b is connected to the input terminal 22f. The anode of the other varactor diode 22c is connected to a ground through a second capacitive element 22d for tuning frequency correction and is connected to a ground through a bias resistor 22e. Therefore, each anode of the two varactor diodes 22b and 22c is connected to a ground in direct-current wise. Further, the connection point (cathode) between the two varactor diodes 22b and 22c is connected to the output terminal 22g.

The above-mentioned UHF input tuning circuit 22 is coupled with the trap circuit 1 through a switch diode 21 and a coupling inductive element 23. In other words, the anode of the switch diode 21 is connected to the trap circuit 1, and the inductive element 23 is coupled between the cathode of the switch diode 21 and the input terminal 22f. In addition, the cathode of the switch diode 21 is connected to a UHF/VHF switching terminal U/V Sw.

In addition, since the cathodes of the two tuning varactor diodes 22b and 22c that serve as the output terminal 22g are connected to the tuning terminal Tu, the capacitive values of the two varactor diodes 22b and 22c are changed by the tuning voltage value. In addition, the output terminal 22g is connected to a UHF high frequency amplifier 12 through a DC cut capacitor 11. At a next stage of the UHF high frequency amplifier 12, a UHF interstage tuning circuit 13 is provided.

Here, a first capacitive element 24 is connected between the output terminal 22g and the other end of the coupling inductive element 23, that is, between the connection point of the output terminal 22g and the switch diode 21 and the output terminal 22g, and a third capacitive element 25 is connected between the anode of the varactor diode 22c (that is, the connection point between the second capacitive element 22d and the resistor 22e) and the other end of the inductive element 23.

In the above-mentioned structure, in the case of receiving the VHF band television signal, the VHF high frequency amplifier 4 becomes an operation state, the switch diode 21 is turned off and the UHF high frequency amplifier 12 becomes a non-active state. In the case of receiving the UHF band television signal, the UHF high frequency amplifier 12 becomes an operation state, the switch diode 21 is turned on and the VHF high frequency amplifier 4 becomes a non-operation state.

In addition, in the case of receiving the high band television signal in the VHF band, the switch diode 2f is turned on and the VHF input tuning circuit 2 is tuned to the high band. In the case of receiving the low band television signal in the VHF band, the switch diode 2f is turned off and the VHF input tuning circuit 2 is turned to the low band.

In addition, the tuning frequency is changed by the tuning voltage applied to the tuning varactor diode 2a and the image frequency is also attenuated by the capacitor 8, thereby improving the image disturbance ratio.

Further, in the case of receiving the UHF band television signal, the switch diode 21 is turned on and thus the television signal is input to the UHF input tuning circuit 22. In addition, the UHF input tuning circuit 22 is also tuned to a desired channel frequency which must be received by the tuning voltage applied to the varactor diodes 22b and 22c.

Figure 2:
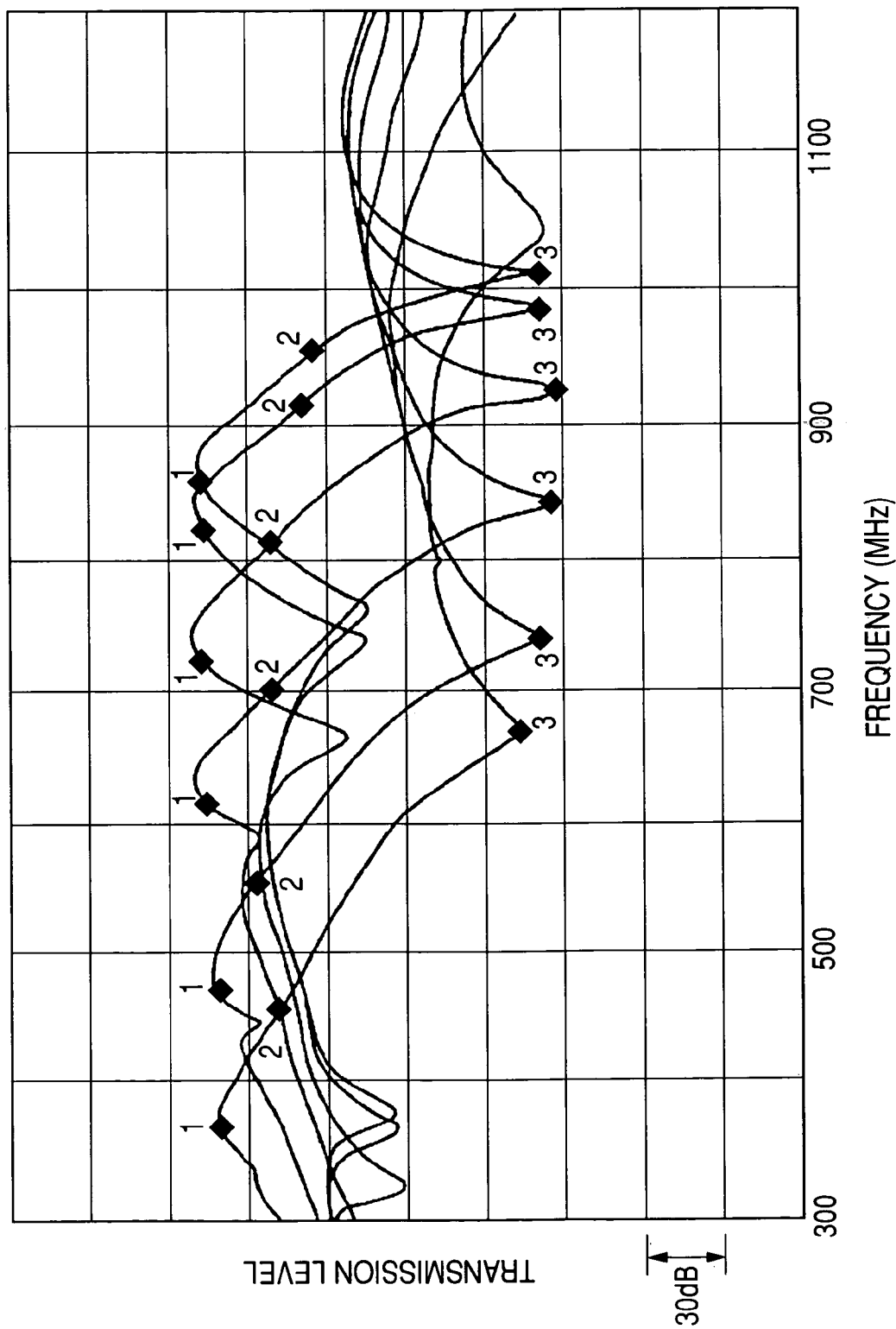
FIG. 2 is a transmission characteristic diagram of the television tuner according to the present invention.
Figure 3:
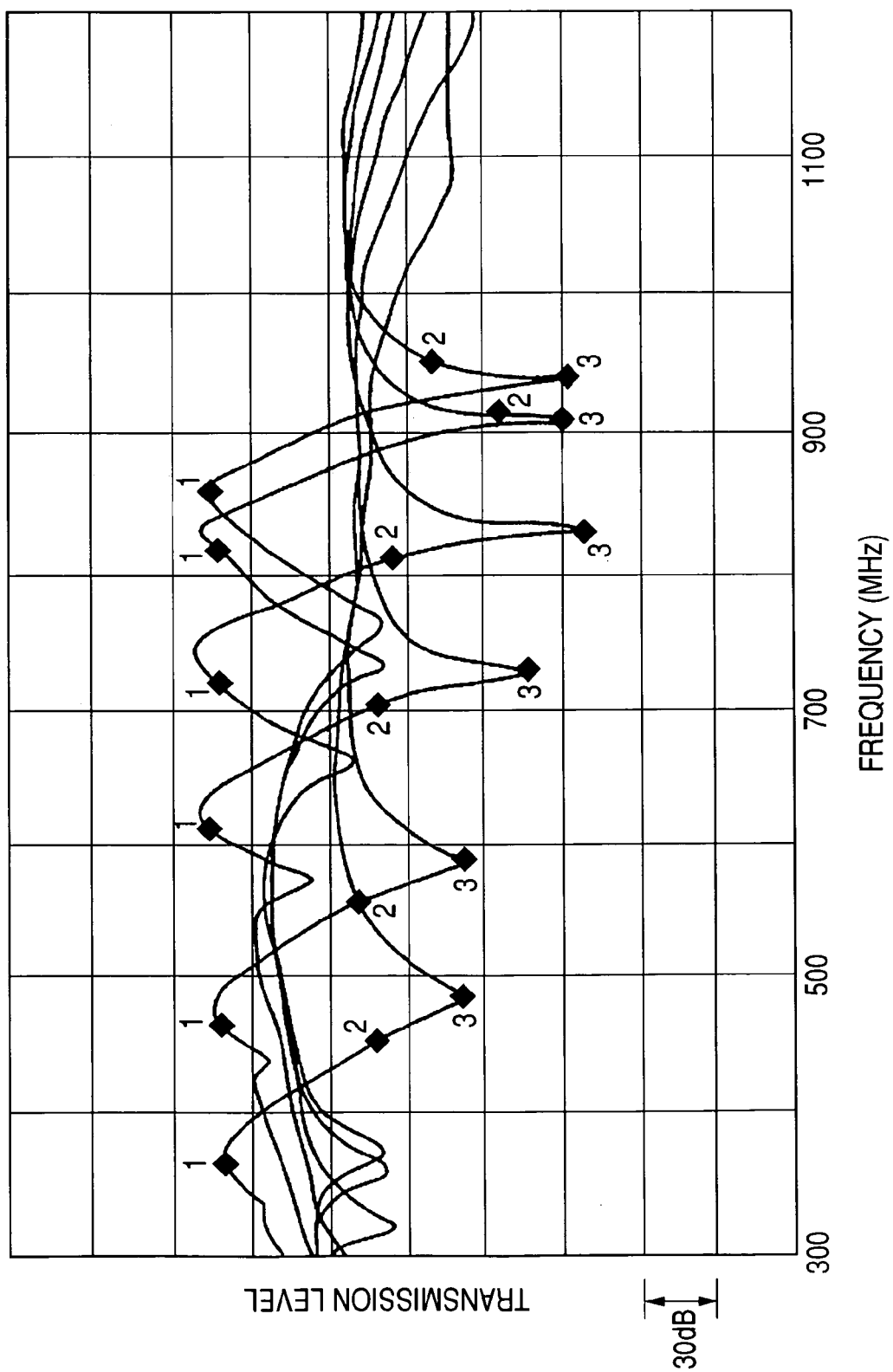
FIG. 3 is a transmission characteristic diagram of the television tuner according to the present invention.
Figure 4:
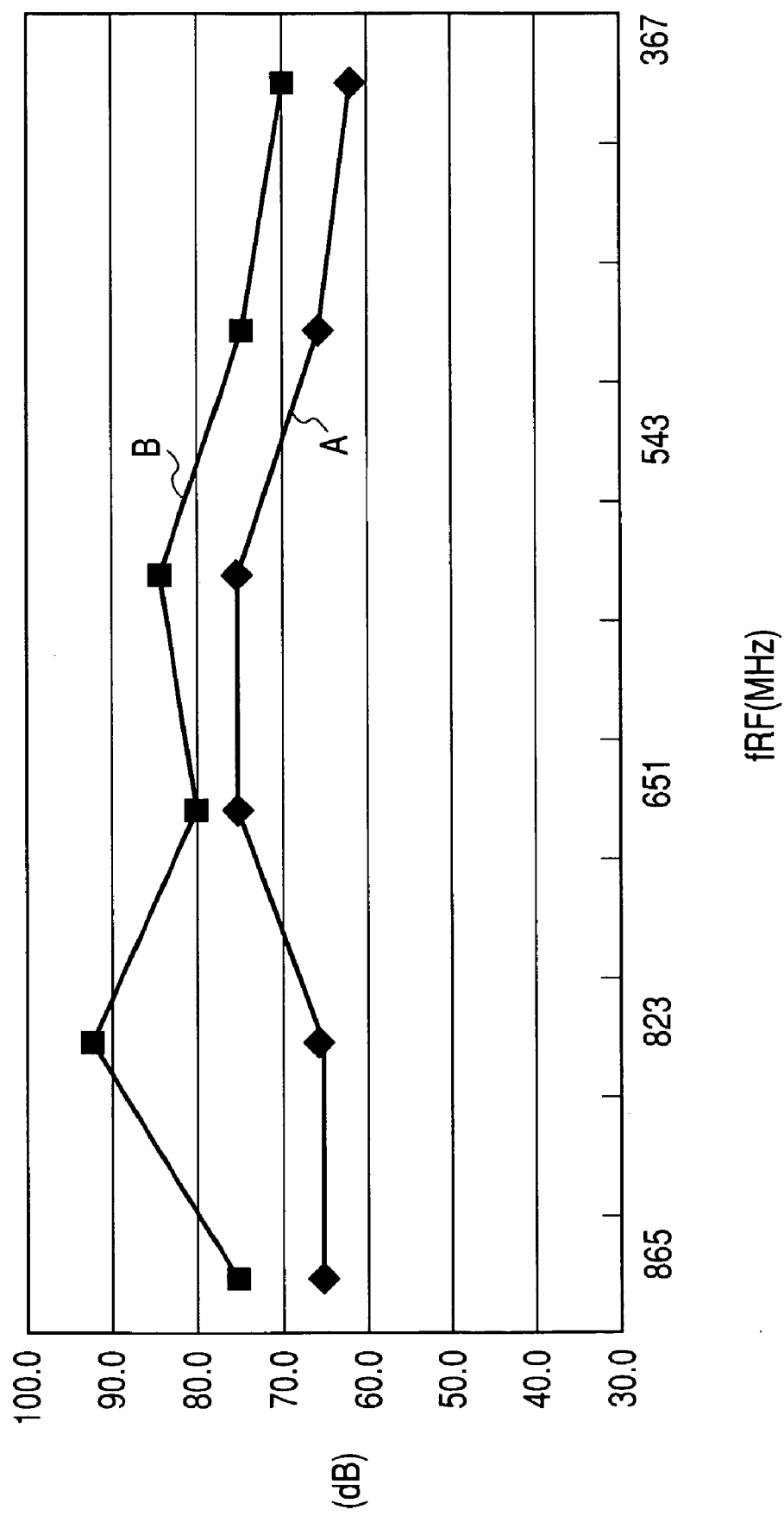
FIG. 4 is an image disturbance characteristic diagram of the television tuner according to the present invention.

FIGS. 2 and 3 show transmission characteristic diagrams in the output terminal 22g of the UHF input tuning circuit 22 and show a case of being tuned to six frequencies in a range of from 367 MHz to 865 MHz (see the frequency of the horizontal axis in FIG. 4). Each curve point 1 showing the transmission characteristic is the location of the frequency of a received channel, the point 2 is the location of the image frequency (the intermediate frequency twice higher than that of each point 1) for the frequency of the received channel, and the point 3 is the location of the frequency for which a maximum attenuation point is applied in the transmission characteristic. The point 3 at the maximum attenuation point is changed so as to correspond to the location of the frequency (point 1) of the received channel.

FIG. 2 shows a transmission characteristic of a case in which the third capacitive element 25 is removed and only the first capacitive element 24 is used in FIG. 1, the point 3 at the maximum attenuation point is generated due to the parallel resonance by the inductive element 23, the varactor diode 22b connected in series to the inductive element 23 and the first capacitive element 24 connected in parallel to the inductive element 23 and the varactor diode 22b. The point 3 is located at the side higher than the point 2 of the image frequency, but, in view of that the attenuation at the location of the point 2 is generated due to the existence of the point 3, the image disturbance ratio of 60 dB or more can be ensured, as obvious from the curve A in FIG. 4.

In addition, FIG. 3 shows a transmission characteristic of a case in which the third capacitive element 25 is used together with the first capacitive element 24. In this case, since the serially connected varactor diode and the third capacitive element 25 are connected in parallel with respect to the serially connected inductive element 23 and the varactor diode 22b, the parallel resonance frequency is significantly changed, the location of the point 3 at the maximum attenuation point becomes close to the point 2 of the image frequency, and the attenuation at the location of the point 2 increases. Therefore, the image disturbance ratio is further improved, as obvious from the curve B in FIG. 4.

What is claimed is:

1. A television tuner comprising:
   a tuning circuit having two varactor diodes coupled to one another and having a connection point between the two varactor diodes serving as an output terminal; and
   a coupling inductive element having one end connected to an input terminal of the tuning circuit and another end of the coupling inductive element being coupled to an input terminal of a television signal,
   wherein one of the varactor diodes is coupled to the input terminal of the tuning circuit, the other of the varactor diodes is interposed between the output terminal and a ground, and a first capacitive element is coupled to the connection point of the two varactor diodes and the other end of the inductive element.

2. The television tuner according to claim 1, wherein a second capacitive element is interposed between the other of the varactor diodes and the ground, and a third capacitive element is coupled to a connection point between the other of the varactor diodes and the second capacitive element and the other end of the inductive element.

3. The television tuner according to claim 2, wherein the tuning circuit has a tuning inductive element having one end coupled to the input terminal and another end coupled to the ground, and wherein cathodes of the two varactor diodes are connected to each other, an anode of one of the varactor diodes is coupled to the input terminal and an anode of the other of the varactor diodes is coupled to the ground through a resistor.

\* \* \* \* \*